United States Patent [19]

Koltuniak et al.

[11] Patent Number: 4,610,388
[45] Date of Patent: Sep. 9, 1986

[54] CIRCUIT BOARD AND COMPONENT MANIPULATION DEVICE

[75] Inventors: Thomas A. Koltuniak, Huntington Beach; William A. Lawrence, Palos Verdes Estates, both of Calif.

[73] Assignee: Eldon Industries, Inc., Inglewood, Calif.

[21] Appl. No.: 583,113

[22] Filed: Feb. 24, 1984

[51] Int. Cl.$^4$ ............................................. B23K 1/12
[52] U.S. Cl. ..................................... 228/6.2; 228/20; 219/373
[58] Field of Search ................. 228/20, 242, 240, 264, 228/6.2; 219/373

[56] References Cited

U.S. PATENT DOCUMENTS

| | | | |
|---|---|---|---|
| 3,420,430 | 1/1969 | Goetz et al. | 228/6.2 |
| 3,422,247 | 1/1969 | Royston et al. | |
| 3,524,247 | 8/1970 | Goldschmied | 228/242 |
| 3,611,561 | 10/1971 | Dosier | 228/6.2 |
| 3,644,980 | 2/1972 | Class, Jr. et al. | 228/20 |
| 3,661,315 | 5/1972 | Helton | 228/20 |
| 4,066,204 | 1/1978 | Wirbser et al. | 228/20 |
| 4,193,160 | 3/1980 | Vandermark | 228/20 |
| 4,295,596 | 10/1981 | Doten et al. | 228/264 |
| 4,426,571 | 1/1984 | Beck | 228/242 |
| 4,552,300 | 11/1985 | Zovko et al. | 228/264 |

OTHER PUBLICATIONS

IBM Technical Disclosure Bulletin, vol. 11, No. 10, Mar. 1969, 1298.

Primary Examiner—Nicholas P. Godici
Assistant Examiner—Samuel M. Heinrich
Attorney, Agent, or Firm—K. H. Boswell; Edward D. O'Brian

[57] ABSTRACT

A circuit board and component manipulation device includes a housing having a circuit board clamp located thereon for positioning a circuit board on the housing. Hot gas for soldering or desoldering operations can be directed to components on the circuit board from one or the other of both an upper gas duct and a lower gas duct, both of which are fed gas from a blower. Each of the ducts include an individual heater located therein so as to control heat input to the gas passing through the ducts. The upper duct terminates in a discharge head which includes a nozzle attached thereto. The nozzle includes an appropriate opening so as to receive a circuit component. The opening is surrounded by a skirt with the gas ducts then positioned outwardly from the skirt. By positioning the component within the skirt, the component is isolated from hot gas utilized for soldering or desoldering of the connectors of the component to an appropriate circuit board.

19 Claims, 6 Drawing Figures

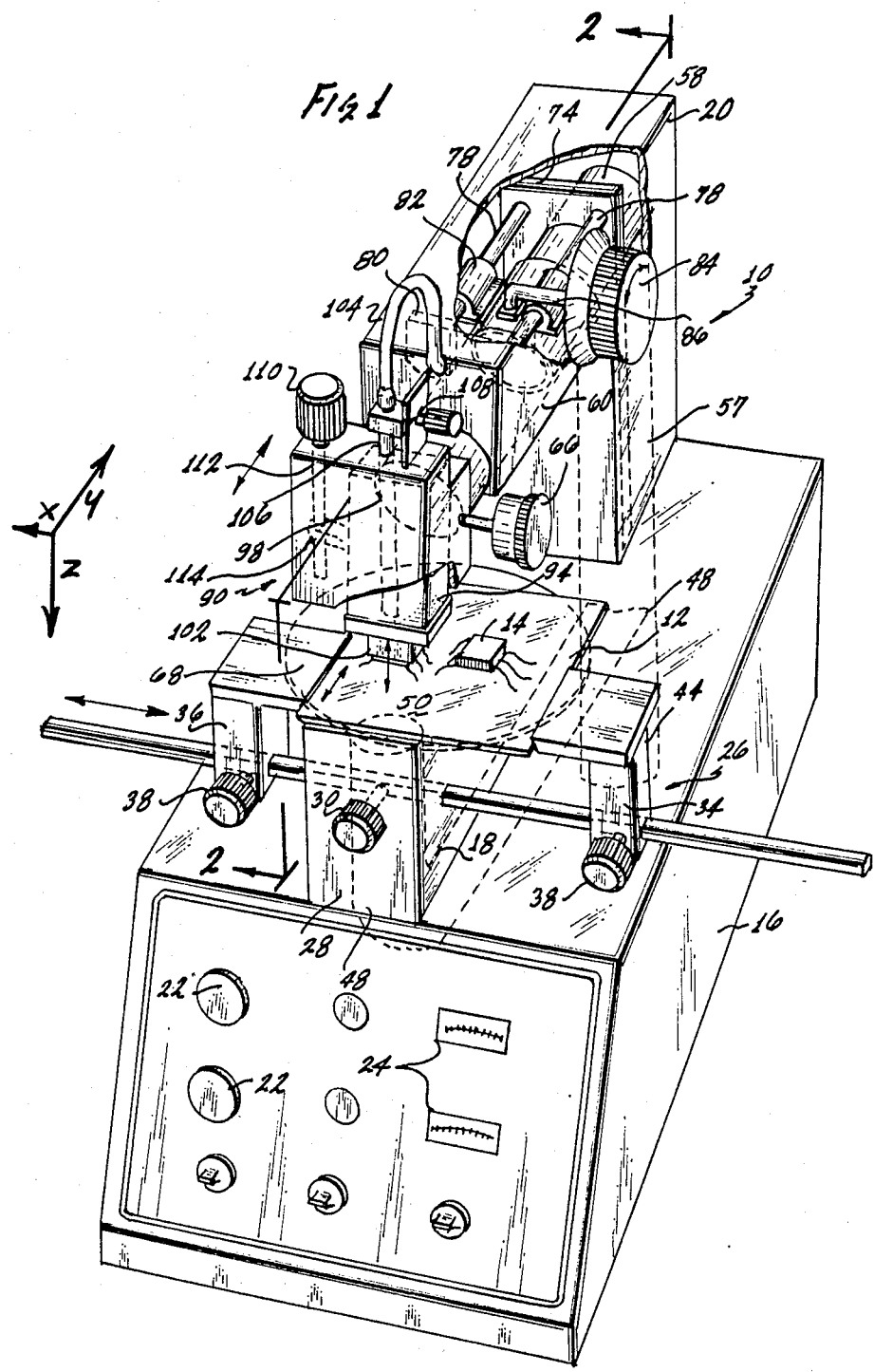

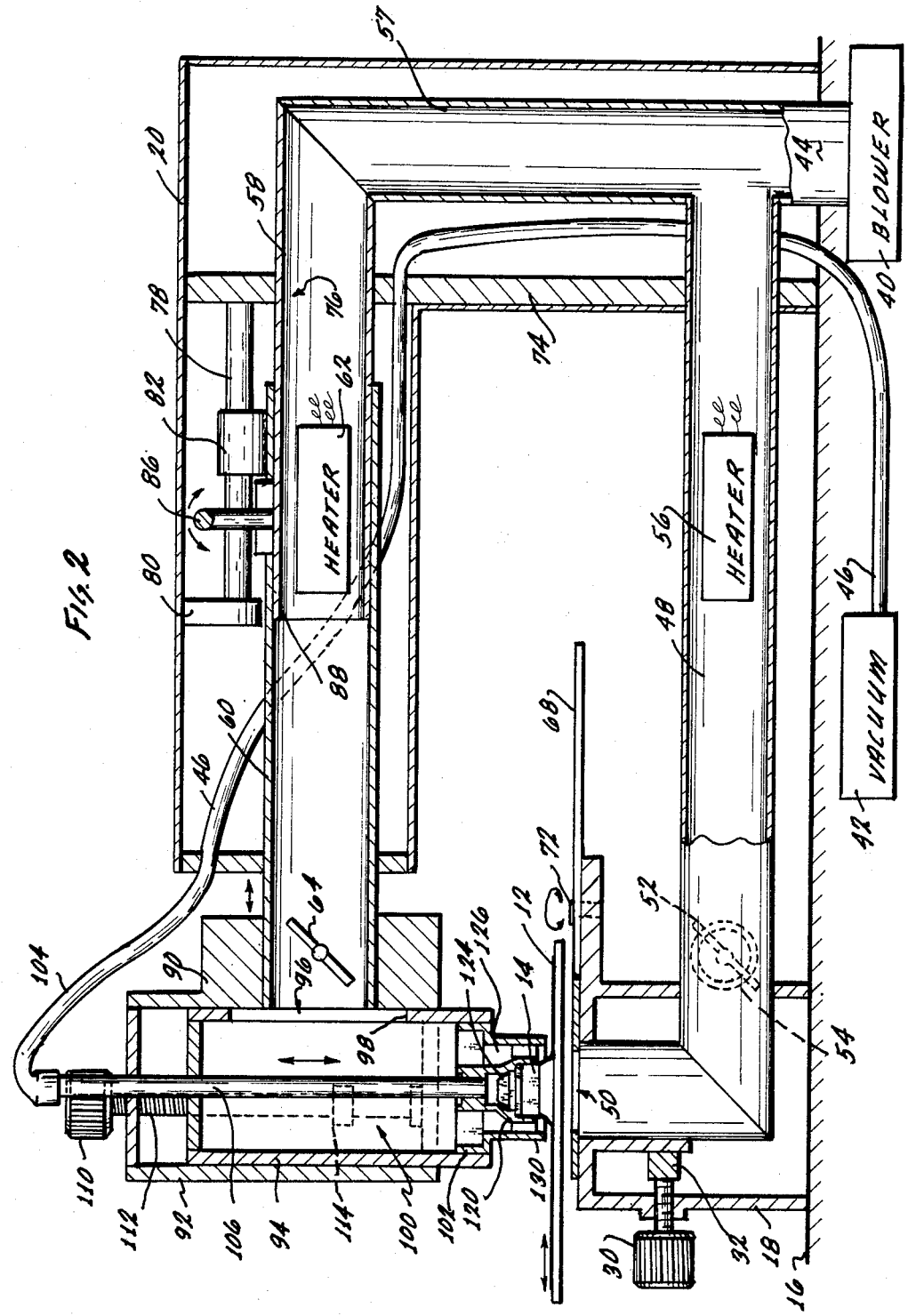

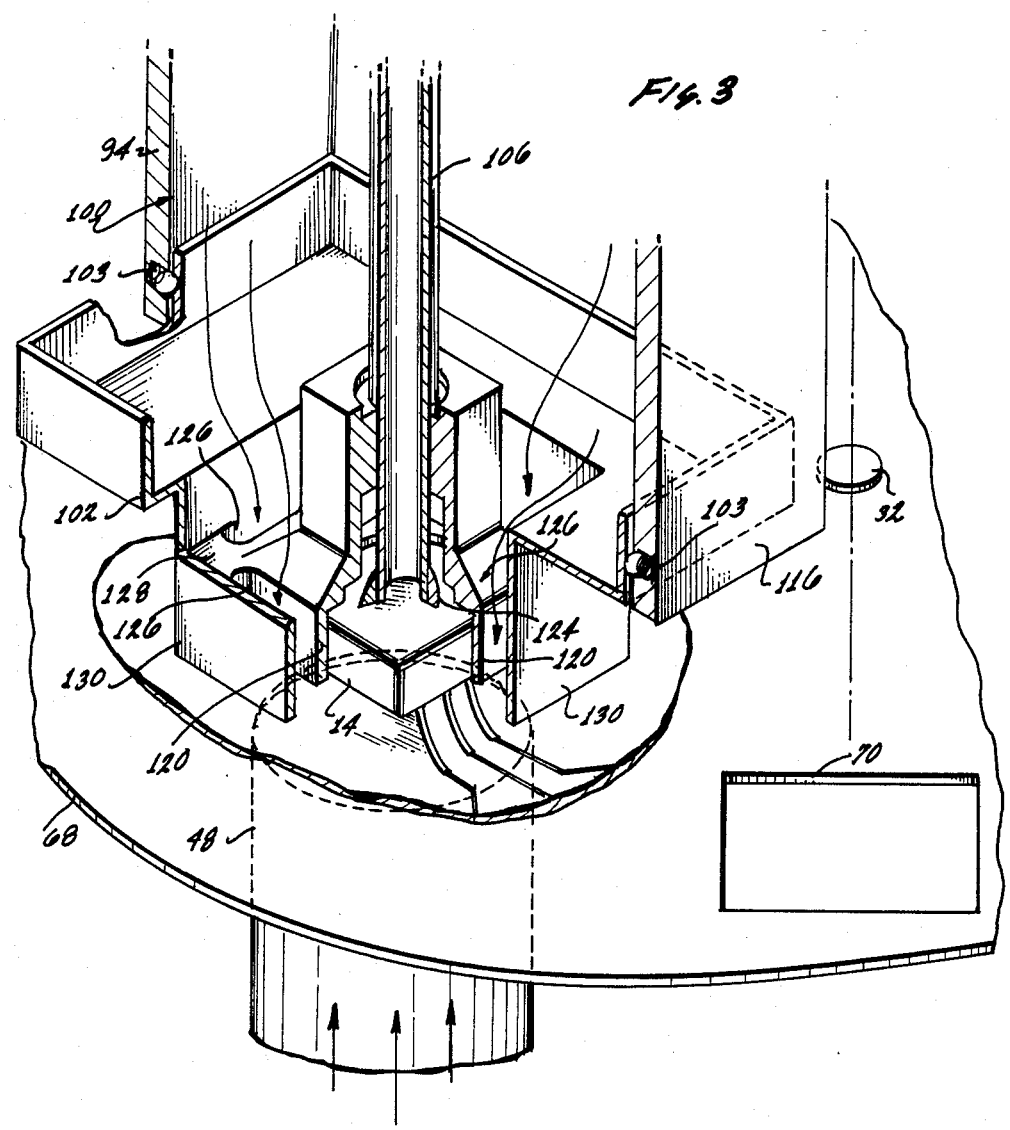
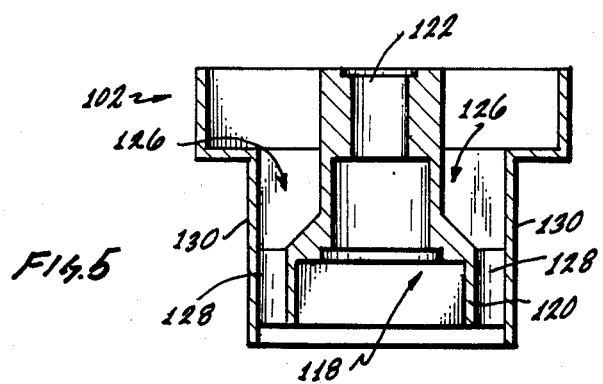

CIRCUIT BOARD AND COMPONENT MANIPULATION DEVICE

BACKGROUND OF THE INVENTION

This invention is directed to a device for the manipulation and heating of components on circuit boards for soldering and desoldering these components to the circuit board.

It has been previously proposed, and devices have been built, based upon the principle of utilizing a hot gas to assist in the soldering and desoldering of components to printed circuit boards and the like. The simplest of these devices consists of simply a hot air gun which is capable of being hand held and discharging a stream of heated air out of an appropriate nozzle. While this certainly has its utilitarian merits, and is very useful for minor repairs and the like on printed circuit boards, it does not lend itself to large scale manufacturing or repair of printed circuit boards.

In essence, the hand held guns can take one of two forms. First, they could have a very small discharge orifice for the hot air, allowing for pin point use of the gun at a very small area, or secondly, they could have a very large discharge orifice, allowing for discharge of heated air over a substantially greater area. Because of the compactness of printed circuit boards and the like, the guns having a large discharge orifice are not very useful. On a printed circuit board, a first connection may be located very closely to a second connection. If a gun with a large orifice is utilized, the possibility exists of melting more solder connections than is desirable. As such, in attempting to remove a component at a first solder connection inadvertently the solder at the second solder connection can also be softened and caused to flow leading to loss of the component or shorting of the board caused by the solder flow.

The hand held guns which have a small discharge orifice, while providing the control necessary to work on a printed circuit board, unfortunately are not useful in desoldering IC's (integrated circuits) mounted on a printed circuit board because of the multiple connectors which must be simultaneously desoldered in order to remove the IC.

A further device is known which is directed to solely removing IC's which have pins which pass through holes on printed circuit boards. This device utilizes a pool of molten solder into which the portions of the pins of the IC's which extend below the bottom of the printed circuit board are dipped. Heat from the molten solder is transferred to the pins to melt the solder connections between the pins and the board. The IC is then lifted from the board by a spring loaded gripper. While this device certainly has utilitarian function to remove IC's of the type having pins which pass through holes in a printed circuit board, it is useless with respect to soldering those same IC's on to a board or in any way whatsoever with regard to IC's which only attach to the top surface of a printed circuit board.

A further device for removing IC's which are simply attached to the top surface of a printed circuit board utilizes a vacuum head having a plate with a plurality of holes arranged in a grid on the plate. The vacuum plate is then encircled with a heating device such that the vacuum head and an IC located in the vacuum head are heated to a temperature sufficient to melt the solder attaching the IC to the circuit board. Since this device utilizes heat conducted by the IC itself to desolder the IC, it of course is useful for desoldering the IC's wherein the IC is being removed because of a malfunction or the like. The device, however, would not be useful for soldering IC's to the board for the very reason that the IC's must be heated to serve as heat conductors for the soldering operation. This would be very detrimental to heat sensitive IC's and the like.

A final device utilizes a blower and heater to pass hot air through both an upper and lower hot air tube. A printed circuit board is positioned between the discharge orifices of both the upper and lower hot air tubes with the hot air then serving to melt the solder for a desoldering operation. Since the pins of the IC are located on both sides of the body of the IC, the IC itself is also placed into the hot air stream, such that it is in the hot environment of the hot air. This could lead to compromising of the function of the IC if attempts were made to use this device for a soldering operation. Further with this device, since the hot air discharge tubes are of a diameter sufficiently greater than most IC'S, the heat not only is directed to the IC which is currently being desoldered, but it is also spread to adjacent IC's, with the potential of desoldering these adjacent IC's or damaging them because of exposure to heat.

BRIEF DESCRIPTION OF THE INVENTION

In view of the above, it is evident that many expedients have been tried in order to utilize hot air in both soldering and desoldering operations for IC's being attached to printed circuit boards or the like. Further in view of the above, it is evident that for one reason or another, all of the known devices leave something to be desired with regard to their operation. It is therefore a broad object of this invention to provide an apparatus for soldering and desoldering of IC's, surface mounted devices and the like to printed circuit boards which utilizes hot air as the thermal conducting medium, but which also provides for positioning of the discharge orifices of the hot air delivery tubes such that they can be easily and conveniently manipulated across the surface of a printed circuit board. It is a further object of this invention to provide a device which allows for control of the temperature and air flow being directed to the printed circuit board. It is an additional object of this invention to provide a device which serves to direct the hot air only to the pin regions of the IC or the like, not to those regions of the IC or the like in which the electrical circuits are located. Additionally, it is an object of this invention to provide a device which provides fast and reliable operation such that the device lends itself to use in industrial or multiple use setting.

These, and other objects, as will become evident from the remainder of this specification are achieved in a circuit board and component manipulation device which comprises: a housing; a printed circuit board holder movably mounted on said housing; gas means for supplying a stream of gas; an upper gas duct having ends, one of said ends connected to said gas means whereby gas from said gas means is introduced into said one end and passes through said upper duct and is discharged from the other of said ends of said upper gas duct; upper duct gas heating means located in said upper gas duct for heating the gas in said duct as said gas passes through said duct; a gas delivery head attaching to the other end of said duct, said gas delivery head including a gas passageway through said head, said gas passageway having ends, one of said ends of said gas passageway in operative association with the other of said ends of said upper gas duct so as to receive gas passed through said upper gas duct, the other of said ends of said gas passageway positioned in association with said printed circuit board holder so as to discharge gas towards a selected area of a circuit board positioned in said circuit board holder; at least one of said circuit board holder and said gas delivery head movable in each of the X, Y and Z directions of an XYZ coordinate system.

Preferredly, the device would include a lower gas duct, also having ends, with the discharge end of the lower gas duct located in association with the bottom surface of a circuit board when the circuit board is located in the circuit board holder. As with the top gas duct, the lower gas duct would be provided with a heating means, and further, both the upper and lower gas ducts would include appropriate control means capable of controlling the flow of gas passing through the ducts, as well as the temperature of the gas passing through the ducts.

Preferredly, the device would be utilized with a nozzle means forming a part of the gas delivery head. The nozzle means would serve as the final gas orifice of the device from which the hot air from the upper gas duct was discharged toward the component being operated on on the printed circuit board. The nozzle means preferredly would include a shield means for shielding the component from the heat effects of the gas stream. Further, a vacuum can be provided in the device with a vacuum orifice located in the nozzle for engaging the component being operated on and holding the component to the nozzle.

In the preferred embodiment of the nozzle means, the nozzle would include a central component mating region and a peripheral gas discharge. Preferredly, a dividing skirt would be positioned between the central component mating region and the peripheral gas discharge region so as to direct hot gas from the peripheral gas discharge region away from the central component mating region.

BRIEF DESCRIPTION OF THE DRAWINGS

This invention will be better understood when taken in conjunction with the drawings wherein:

FIG. 1 is an isometric view of a device embodying the concepts of the invention;

FIG. 2 is a side elevational view of a portion of the device seen in FIG. 1 taken about the lines 2—2 of FIG. 1 and further including certain components shown in a schematic representational form;

FIG. 3 is an isometric view in partial cutaway showing the nozzle component of the device located in association with an electronic component and a portion of a printed circuit board;

FIG. 5 is a side elevational view in section of the component seen in FIG. 3.

Figure 4:
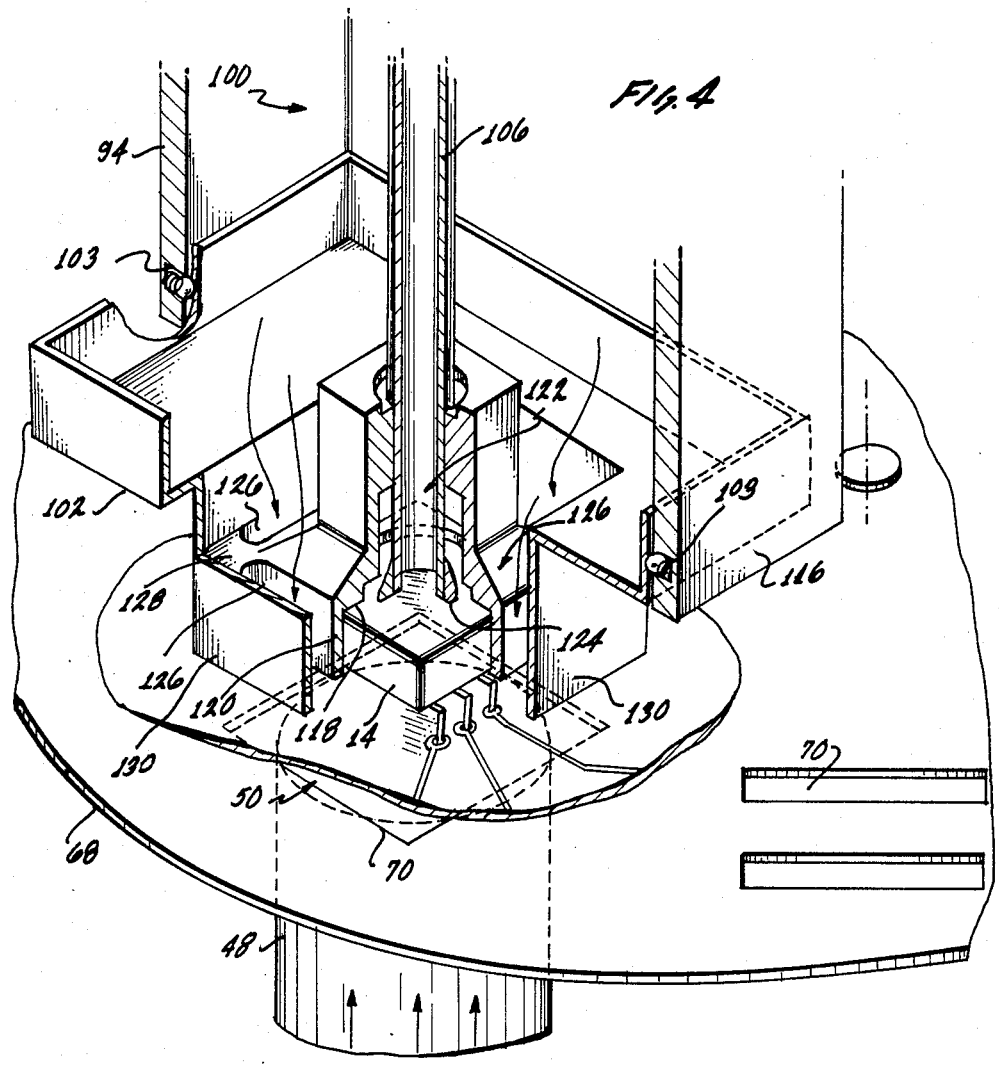
FIG. 4 is an isometric view of components located directly underneath the circuit board as seen in FIG. 3.
Figure 6:
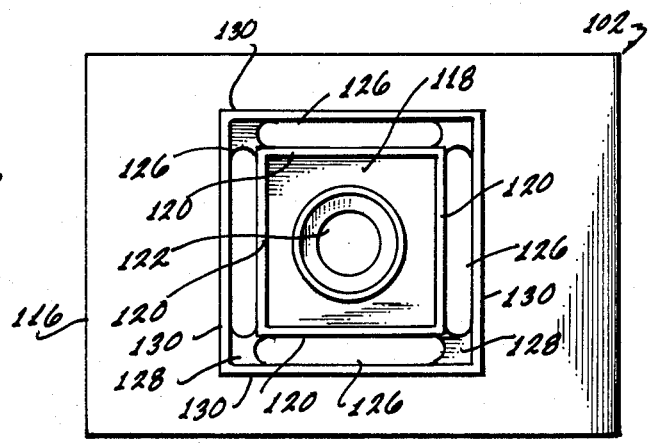
FIG. 6 is a bottom plan view of the component of FIG. 5.

The invention described in this specification and shown in the drawings utilizes certain principles and/or concepts as are set forth in the claims appended to this specification. Those skilled in the arts to which this invention pertains will realize that these principles and/or concepts are capable of being utilized in a variety of embodiments which may differ from the exact embodiment utilized for illustrative purposes herein. For this reason, this invention is not to be construed as being limited solely to the illustrative embodiment but is only to be construed in view of the claims.

DETAILED DESCRIPTION OF THE INVENTION

In the Figs. there is shown a circuit board and a component manipulation device 10 which serves as a solder/desolder device for attaching/detaching IC's or other similar devices to printed circuit boards. As shown in FIG. 1, the device 10 has a printed circuit board 12 mounted on the device with one of the integrated circuit components, collectively identified by the numeral 14, located in a work position on the device. With increasing miniaturization of solid state devices, more and more components can be located on to a printed circuit board. The criticality of locating these components or removing a damaged component without interfering with the functioning or physical positioning of adjacent components, increases with each step in miniaturization.

It was a standard in the electronics industry several years ago to utilize IC's which had pins which projected through holes in printed circuit boards. The IC was then connected to the board by passing its pins through the holes of the board followed by soldering the pins into the holes with the solder connection extending onto the printed grids on the circuit board. With the introduction of large scale, and very large scale integrated devices, the industry has drifted away from pins passing through the circuit board and now favors the utilization of attaching the pins or leads from these devices only to the top surface of the circuit board. The leads or connectors from these devices are reduced in physical size compared to the pass through pins or previous devices. This has increased the criticality of the soldering and desoldering operations with respect to attaching and detaching these devices from these printed circuit boards.

The device 10 has several outer components. This includes the base 16, a lower duct shroud 18 located on top of the base 16 and an upper duct shroud 20. The upper duct shroud 20 is essentially an inverted "L" shaped unit, mating with the lower duct shroud on the top of the base 16. Located on the front of base are appropriate control knobs collectively identified by the numeral 22 as well as appropriate read out devices collectively identified by the numeral 24 for controlling the temperature of the gas discharged from the device. Further, appropriate indicator lights and switches, not separately identified or numbered, are included on the front face of the base 16.

Located on the forward end of the lower base duct shroud 18 is the printed circuit board holder assembly 26. This includes a central locking clamp 28 having a knurled knob 30 located thereon through which passes an elongated rod 32 which is square in cross section. Attached to the rod 32 is a right circuit board clamp 34 and a left circuit board clamp 36. Each of these include an appropriate knurled knob collectively identified by the numeral 38 allowing for individual positioning of these board clamps along the length of the rod 32. Each of the clamps 34 and 36 have a horizontally oriented slot 37 to engage the side edge of the circuit board 12.

The circuit board 12 is clamped between the right and left circuit board clamps 34 and 36 by positioning these clamps along the length of the rod 32 and fixing their positions with the knobs 38 which are each connected to a threaded rod, not separately shown or numbered, which passes through the clamps 34 and 36 and engages the rod 32. Once the board 12 is appropriately positioned between the clamps 34 and 36, the totality of the assembly can be slid horizontally to the right and left along the x direction of an x y z coordinate system by loosening the knurled knob 30 and sliding the rod 32 with its appropriately attached clamps 34 and 36 and circuit board 12 as a unit to the left and right.

Located within the base 16 is a blower 40 and a vacuum motor 42, both shown in schematic representational form in FIG. 2. These are appropriately connected to the switches on the front of the base 12 for turning off and on. A common duct 44 leads from the blower 40 upward from the base 6 and a vacuum line 46 leads from the vacuum motor 42 upwardly from the base 16 into the upper duct shroud 20.

Attaching to the common duct 44 is a lower gas duct 48 which passes through the length of the lower duct shroud 18. Near the discharge end 50 of the lower duct 48 is a butterfly valve 52. This is controlled via control knob 54 extending out of the lower duct shroud 18 so as to control the flow of air passing through the lower duct 48 which is ultimately discharged from the discharge end 50.

Located within the lower duct 48 is a lower heater unit 56. This can be any one of a number of standard heater elements such as a common nichrome wire element wound around an appropriate mica or other insulated support. In any event, the lower heater 56 placed within the gas pathway in the lower duct 48 appropriately heats gas passing through the lower duct 48 prior to discharge from the discharge end 50. The heater 56 is under control of certain of the control knobs 22 on the base 16 and it further includes appropriate sensors (not shown) connected to the read out devices 24 such that an appropriate indication of the temperature of the gas which is ultimately discharged from the lower duct 48 is made available to the operator of the device 10.

An upper duct 57, which is composed of rear component 58 and front component 60 is also appropriately connected to the common duct 44 to receive air from the blower 40. An upper heater 62 is positioned within the rear component 58 of the upper duct 57 so as to heat gas passing through the upper duct 57 prior to discharge as is described below. The upper heater 62 is also a standard component like the lower heater 56 and is further appropriately attached to the control knobs and read out device 22 and 24 located on the base 16 as was described for the lower heater 56.

A top butterfly valve 64 is located in the upper duct 57 so as to control the flow of gas through the upper duct 57. The butterfly valve 64 includes an appropriate control knob 66 so that air flow through the upper duct can be controlled by hand manipulation of the control knob 66. In many instances, especially those wherein components are being attached to a circuit board 12 only to the top surface of the circuit board, only gas flow through the upper duct 57 will be utilized for melting solder. In these instances, gas passing through the upper duct 57 will be heated to a higher temperature than gas passing through the lower duct with the gas passing through the lower duct 48 simply serving to warm the bottom of the circuit board. In other instances, gas passing through the lower duct 48 might be totally closed off by the butterfly valve 52 with all of the gas then being channelled through the upper duct 57.

A rotating disk 68 is located at the discharge end 50 of the lower duct 48. The rotating disk 68 includes appropriate cutouts 70 having different sizes and shapes so as to accommodate a variety of devices (not shown) being attached to or detached from the circuit board 12. If a component 14 having pass through pins (not separately numbered) is utilized as is shown in FIG. 4, a cutout 70 having an appropriate configuration to encompass all of the ends (not separately numbered) of the pins (not separately numbered) which pass through the circuit board 12 would be chosen. If other components 14, such as a surface mounted component 14 which is located solely on the top of the circuit board as is shown in FIG. 3 is used the disk 68 might be rotated to seal the end 50 of the lower duct 48. The rotating disk 68 is attached to the discharge end 50 of the lower duct 48 via an appropriate pin or the like such as pin 72 which would mate with an appropriate support structure at the discharge end 50 of the lower duct 48.

Within the upper duct shroud 20 near the rear of the device 10 is a support plate 74. It includes an appropriate opening 76 through which the rear component 58 of the upper duct 57 passes. Two support rods, 78 are positioned on the left and right upper corner (not separately numbered) of the plate 74. The rods 78 are appropriately attached to brackets 80 so as to provide support of other components ultimately supported by the plate 74 as hereinafter described. Two cylindrical bearings, 82 ride on the rods 78.

The front component 60 of the upper duct 57 is attached to the bearings 82. This suspends the front component 60 from the rods 78. The front component 60 is slightly oversized with respect to the rear component 58 such that it slides over the rear component in a telescopic manner. The diameters of these two components 58 and 60 are chosen such that while they are allowed to slide one over the other, there is a very tight tolerance such that a gas tight or essentially gas tight seal is formed between these two components of the upper duct 57.

A y direction control knob 84 is located on the upper duct shroud 20. A rod 86 extends from the back of the control knob 84 and includes a 90 degree bend 37 near its end 89. This bend 87 fits into a slot 88 formed on the front component 60 of the upper duct. Rotation of the control knob 84 thus moves the end of the rod 86 backward and forward in the slot 88 causing movement of the front component 60 with respect to the rear component 58 of the upper duct. This movement is further transmitted to other components also attaching to the front component 60.

A gas delivery head 90 attaches to the front end of the front component 60 of the upper duct. The head 90 includes a support housing 92 in which slides a movable inner chamber 94. The housing 92 is fixedly attached to the front component 60 of the upper duct. However, the movable inner chamber 94 moves with respect to the discharge opening 96 of the front component 60 of the upper duct. The movable inner chamber 94 includes an elongated slot 98 which moves up and down across the discharge opening 96 so as to always form a continuous gas passageway from the front component 60 of the upper duct into the movable inner chamber 94. A passageway 100 leads from the slot 98 downwardly to the bottom of the inner chamber 94. A nozzle 102 as hereinafter described in greater detail is appropriately mounted to the bottom of the inner chamber 94 with the nozzle 102 fitting on to the lower opening of the passageway 100 such that gas passing through the passageway 100 is directed to the nozzle 102.

The vacuum line 46 leads upward through the upper duct shroud 20 and extends from the front of the upper duct shroud 20. A flexible tubing 104 then attaches to the vacuum line 46 with the flexible tubing then leading to a solid vacuum tube 106 which passes through the movable inner chamber 94 downwardly into the nozzle 102. A clamp 108 on the top of the housing 92 can be tightened to fix the solid vacuum tube 106 with respect to the housing, or it can be loosened allowing the solid vacuum tube 106 to rise or fall in conjunction with movement of the movable inner chamber 94 and the nozzle 102 attached thereto.

A knob 110 located on the top of the housing 92 is attached to a vertically oriented threaded rod 112. The movable inner chamber 94 carries a threaded ear 114 fixedly attached to its left hand side. The threaded rod 112 passes through this ear such that rotation of the knob 110 is transferred to the threaded rod 112 with rotation of the threaded rod 112 then being translated into vertical up and down movement of the ear 114 and the movable inner chamber 94 attached thereto. In this manner, the movable inner chamber 94 and the nozzle 102 attached thereto can be moved upward and downward along the z direction of an x y z coordinate system.

As explained above, the movable inner chamber 94, since it is attached to the housing 92 and the front component 60 of the upper duct 58, also can move backward and forward along the y direction of an x y z coordinate system. As such, the movable inner chamber 94 is capable of executing movement along both the y and z directions of this x y z coordinate system. As explained below, the circuit board clamps 34 and 36, since they are attached to the rod 32 are capable of executing movement along the x direction of this coordinate system. Further, the circuit board 12 can be made to execute movement along the y direction by attaching it within the clamps 34 and 36 with a sufficient pressure to hold it but with insufficient pressure to restrain it from moving in the slots in the clamps 34 and 36 also along the y direction of the x y z coordinate system. Normally, however, movement along the y direction would be effected by moving the gas delivery head 90.

Many circuit boards contain components other than integrated circuits and the like. These other components, such as capacitors and the like can extend upwardly along the z axis on the circuit board. Without the capability of movement of the inner chamber 94 upwardly and downwardly along this Z direction, in order to move from front to back or back to front along a circuit board 12 without this capability, the circuit board 12 would have to be dismounted from the clamps 34 and 36.

The nozzle 102 is shown in greater detail in FIGS. 3, 4, 5 and 6. In those Figs. a particular embodiment of a nozzle 102 is shown. A variety of embodiments of the nozzle 102 are utilized depending upon the exact configuation of the component which is being attached to or detached from the circuit board 12. The nozzle 102 and other nozzles similar to it, differing only with regard to certain geometry as described below, are simply snap fitted via check ball 103 to the bottom of the movable inner chamber 94 so that they move in conjunction with the movable inner chamber 94. The check balls 103 fit into appropriate depressions on the sides of the nozzle 102.

The nozzle 102 includes a base plate 116 which fits adjacent to the bottom of the movable inner chamber 94. A component mating surface 118 is centrally located within the nozzle 102. Surrounding the component mating surface 118 is a skirt 120. The skirt 120 and the mating surface 118 are sized and shaped such that an electronic component fits within the inside perimeter of the skirt 120 and can be positioned against the mating surface 118. A central bore 122 extends downwardly into the nozzle 102 and opens into the surface of the mating surface 118. The solid vacuum 106 fits down into the bore 122 such that its end having a rubber ring 124 can engage the top of a component located within the interior perimeter of the skirt 120 to create a vacuum seal between the top of the component and the solid tube 106. This allows pulling the component tightly within the nozzle 102 to position it within the skirt 120 and to hold it there during subsequent operations such as movement of the inner chamber 94 in the Z direction of the X Y Z coordinate system during placement or removal of the component on the board 12.

Gas discharge ducts, 126 are machined into the nozzle 102 surrounding the bore 122. Webs, 128 suspend the skirt 120 and the component mating surface 118 within the nozzle 102. An outer skirt 130 completes the nozzle 102.

The ducts 126 are appropriately connected to the passageway 100 passing through the movable inner chamber 94 when the nozzle 102 is clipped to the inner chamber 94. Hot gas passing from the front component 60 of the upper duct 57 then passes down through the passageway 100 of the inner chamber 94 and into the ducts 126 in the nozzle 102. This gas is then discharged out of the lower opening of these ducts 126. When an electronic component is located next to the component mating surface 118 within the interior periphery of the skirt 120 of the nozzle 102, it is essentially insulated from the passage of the hot gas through the ducts 126 by the skirt 120.

The combination of the skirt 120 and the skirt 130 directs this hot gas downward onto the leads of this component such that they can be soldered or desoldered on the circuit board 12 without overheating the component 14 and thus compromising its operation. Of course, during removal of a defective component 14, this insulative property of the component is not as critical. However, by channelling the hot gas between the skirts 120 and 130, it is directed to a very localized position on the circuit board 12 such that even during a desoldering operation excess hot gas is not directed to adjacent components on the circuit board 12.

Since a variety of the nozzles 102 can easily and conveniently be attached or detached to the gas delivery head 90, the operator of the device 10 can utilize the device 10 to attach or detach a variety of different components 14 to a single circuit board 12 and still protect each and every individual components from excess exposure to heat and the like.

I claim:

1. A circuit board and component manipulation device which comprises:
 a housing;
 a printed circuit board holder movably mounted on said housing;
 gas means for supplying a stream of gas;

gas duct having ends, one of said ends connected to said gas means whereby gas from said gas means is introduced into said one end and passes through said duct and is discharged from the other of said ends of said gas duct;

gas heating means located in said gas duct for heating the gas in said duct as said gas passes through said duct;

a gas delivery head attaching to the other end of said duct, said gas delivery head including a gas passageway through said head, said gas passageway in operative association with the other of said ends of said gas duct so as to receive gas passed through said gas duct, the other of said ends of said gas passageway positioned in association with said printed circuit board holder so as to discharge gas towards a selected area of a circuit board positioned in said circuit board holder;

positioning means associated with said circuit board holder and gas delivery head for changing the relative position between said gas delivery head and a printed circuit board held by said printed circuit board holder along the directions of an x-y-z coordinate system;

component vacuum means, said component vacuum means including an vacuum orifice located on said gas delivery head and means for creating a vacuum located on said housing, said vacuum orifice being capable of operatively engaging a component located in association with said gas delivery head and said means for creating a vacuum capable of creating a vacuum at said orifice so as to maintain said component in said association with said gas delivery head.

2. The device of claim 1 wherein:

said gas duct comprises an upper gas duct and further including;

a lower gas duct having ends, one of said ends connected to said gas means whereby gas from said gas means is introduced into said one end and passes through said lower duct and is discharged from the other of said ends of said lower gas duct, the other of said ends of said lower duct in operative association with said printed circuit board holder so as to discharge gas towards the bottom surface of a circuit board mounted in said printed circuit board holder;

lower duct gas heating means located in said lower duct for heating the gas in said lower duct as said gas passes through said lower duct prior to discharge from the other of said ends.

3. The device of claim 2 further including:

an upper gas duct flow control means located in said upper gas duct and capable of controlling the flow of gas passing through said upper gas duct from said one end of said upper gas duct to the other of said ends of said upper gas duct;

a lower gas duct flow control means located in said lower gas duct and capable of controlling the flow of gas passing through said lower gas duct from said one end of said lower gas duct to the other of said ends of said lower gas duct.

4. The device of claim 3 including:

gas delivery head mounting means attaching said gas delivery head on said housing whereby said gas delivery head moves in both said y and said z directions of said x-y-z coordinate system.

5. The device of claim 1 including:

gas delivery head mounting means movably attaching said gas delivery head on said housing hereby said gas delivery head moves in both said y and said z directions of said x-y-z coordinate system.

6. The device of claim 1 including:

said gas delivery head includes nozzle means for dispensing gas from said gas delivery head, said nozzle means including a gas discharge means in operative association with said gas passageway in said gas delivery head so as to receive gas from said gas passageway and dispense said gas, said nozzle means further including component shield means for shielding a component located in the gas stream dispensed from said nozzle means from said gas stream, and wherein said vacuum orifice is located in said nozzle means.

7. The device of claim 6 wherein:

said shield means includes a hot gas deflection means for insulating a component located in said gas stream from the heat content of said gas stream.

8. The device of claim 6 wherein:

said nozzle means comprises a nozzle having a central component mating region and a peripheral gas discharge region.

9. The device of claim 8 including:

a dividing skirt positioned between said central component mating region and said peripheral gas discharge region, said skirt sized and shaped so as to encase an electrical component being mounted to a circuit board located in said circuit board holder.

10. The device of claim 9 including:

component vacuum means, said component vacuum means including a vacuum orifice located in said nozzle means and means for creating a vacuum located on said housing, said vacuum orifice capable of operatively engaging a component located in association with said nozzle means and said means for creating a vacuum capable of creating a vacuum at said orifice so as to maintain said component in said association with said nozzle means;

said vacuum orifice is located in said central component mating region.

11. A circuit board and component manipulation device which comprises:

a housing;

a printed circuit board holder movably mounted on said housing;

gas means for supplying a stream of gas;

gas duct having ends, one of said ends connected to said gas means whereby gas from said gas means is introduced into said one end and passes through said duct and is discharged from the other of said ends of said duct, gas heating means located in said gas duct for heating the gas in said duct as said gas passes through said duct, a gas delivery head attaching to the other end of said duct, said gas delivery head including a gas passageway through said head, said gas passageway in operative association with the other of said ends of said gas duct so as to receive gas passed through said gas duct, the other of said ends of said gas passageway positioned in association with said printed circuit board holder so as to discharge gas towards a selected area of a circuit board positioned in said circuit board holder, positioning means associated with said circuit board holder and gas delivery head for changing the relative position between said gas delivery head and a printed circuit board held by said printed circuit board holder along the directions of an x-y-z coordinate system, said gas delivery head includes nozzle means for dispensing said gas from said gas delivery head, said nozzle means including a gas discharge means in operative association with said gas passageway in said gas delivery head so as to receive gas from said gas passageway and dispense said gas, said nozzle means further including component shield means for shielding a component located in the gas stream dispensed from said nozzle means from said gas stream, component vacuum means, said component vacuum means including a vacuum orifice located in said nozzle means and means for creating a vacuum located on said housing, said vacuum orifice capable of operatively engaging a component located in association with said nozzle means and said means for creating a vacuum capable of creating a vacuum at said orifice so as to maintain said component in said association with said nozzle means.

12. A circuit board and component manipulation device which comprises:

a housing;

a printed circuit board holder movably mounted on said housing;

gas means for supplying a stream of gas;

gas duct having ends, one of said ends connected to said gas means whereby gas from said gas means is introduced into said one end and passes through said duct and is discharged from the other of said ends of said gas duct, gas heating means located in said gas duct for heating the gas in said duct as said gas passes through said duct, a gas delivery head attaching to the other end of said duct, said gas delivery head including a gas passageway through said head, said gas passageway in operative association with the other of said ends of said gas duct so as to receive gas passed through said gas duct, the other of said ends of said gas passageway positioned in association with said printed circuit board holder so as to discharge gas towards a selected area of a circuit board positioned in said circuit board holder, positioning means associated with said circuit board holder and gas delivery head for changing the relative position between said gas delivery head and a printed circuit board held by said printed circuit board holder along the directions of an x-y-z coordinate system, component vacuum means, said component vacuum means including a vacuum orifice located in said nozzle means and means for creating a vacuum located on said housing, said vacuum orifice capable of operatively engaging a component located in association with said nozzle means and said means for creating a vacuum capable of creating a vacuum at said orifice so as to maintain said component in said association with said nozzle means.

13. The device of claim 12 wherein:

said nozzle means comprises a nozzle having a central component mating region and a peripheral gas discharge region.

14. A circuit board and component manipulation device which comprises:

a housing;

a printed circuit board holder movably mounted on said housing;

gas means for supplying a stream of gas;

gas duct having ends, one of said ends connected to said gas means whereby gas from said gas means is introduced into said one end and passes through said duct and is discharged from the other of said ends of said gas duct, gas heating means located in said gas duct for heating the gas in said duct as said gas passes through said duct, a gas delivery head attaching to the other end of said duct, said gas delivery head including a gas passageway through said head, said gas passageway in operative association with the other of said ends of said gas duct so as to receive gas passed through said gas duct, the other of said ends of said gas passageway positioned in association with said printed circuit board holder so as to discharge gas towards a selected area of a circuit board positiond in said circuit board holder, positioning means associated with said circuit board holder and gas delivery head for changing the relative position between said gas delivery head and a printed circuit board held by said printed circuit board holder along the directions of an x-y-z coordinate system, said gas duct comprises an upper gas duct and further including, a lower gas duct having ends, one of said ends connected to said gas means whereby gas from said gas means is introduced into said one end and passes through said lower duct and is discharged from the other of said ends of said lower gas duct, the other of said ends of said lower duct in operative association with said printed circuit board holder so as to discharge gas towards the bottom surface of a circuit board mounted in said printed circuit board holder, lower duct gas heating means located in said lower duct for heating the gas in said lower duct as said gas passes through said lower duct prior to discharge from the other of said ends, an upper gas duct flow control means located in said upper gas duct and capable of controlling the flow of gas passing through said upper gas duct from said one end of said upper gas duct to the other of said ends of said upper gas duct, a lower gas duct flow control means located in said lower gas duct and capable of controlling the flow of gas passing through said lower gas duct from said one end of said lower gas duct to the other of said ends of said lower gas duct, gas delivery head mounting means movably attaching said gas delivery head on said housing whereby said gas delivery head moves in both said y and said z directions of said x-y-z- coordinate system, component vacuum means, said component vacuum means including a vacuum orifice located in said nozzle means and means for creating a vacuum located on said housing, said vacuum orifice capable of operatively engaging a component located in association with said nozzle means and said means for creating a vacuum capable of creating a vacuum at said orifice so as to maintain said component in said association with said nozzle means.

15. The device of claim 14 wherein:
said vacuum orifice is located in said central component mating region.

16. The device of claim 15 including:
a dividing skirt positioned between said central component mating region and said peripheral gas discharge region, said skirt sized and shaped so as to encase an electrical component being mounted to a circuit board located in said circuit board holder.

17. A nozzle for a hot air solder-desolder device which comprises:
a nozzle body;
at least one gas passageway passing through said body from a first opening on one side of said body to a second opening on a further side of said body;
a component receiving chamber means located in said body, said component receiving chamber means sized and shaped so as to mate with an electrical component, said component receiving chamber means opening into said further side of said body;
a skirt means located on said body and positioned between said gas discharge passageway and said component receiving chamber means, said skirt means inhibiting gas flow from said gas passageway to said component receiving chamber means.

18. The nozzle of claim 17 wherein:
a plurality of said gas passageways located through said body so as to surround said component receiving chamber means.

19. The nozzle of claim 18 further including:
a second skirt means located on said body so as to surround said plurality of gas receiving passageways.

* * * * *